United States Patent [19]
Graef et al.

[11] Patent Number: 6,083,269
[45] Date of Patent: Jul. 4, 2000

[54] DIGITAL INTEGRATED CIRCUIT DESIGN SYSTEM AND METHODOLOGY WITH HARDWARE

[75] Inventors: Stefan Graef, Milpitas; Quang Phan, San Jose, both of Calif.

[73] Assignee: LSI Logic Corporation, Milpitas, Calif.

[21] Appl. No.: 08/914,493

[22] Filed: Aug. 19, 1997

[51] Int. Cl.[7] .................................................. G06F 17/50
[52] U.S. Cl. .............................. 703/14; 703/15; 716/4; 716/5
[58] Field of Search ..................... 395/500.06, 500.05, 395/500.35, 500.36; 364/578, 488, 489, 491, 490; 703/14, 15; 716/5, 4

[56] References Cited

U.S. PATENT DOCUMENTS

| | | | |
|---|---|---|---|
| 5,247,455 | 9/1993 | Yoshikawa | 364/490 |
| 5,323,401 | 6/1994 | Maston | 714/738 |
| 5,371,851 | 12/1994 | Pieper et al. | 345/507 |
| 5,455,928 | 10/1995 | Herlitz | 395/500 |
| 5,493,672 | 2/1996 | Lau et al. | 395/500 |
| 5,528,508 | 6/1996 | Russell et al. | 364/488 |
| 5,541,849 | 7/1996 | Rosotker et al. | 364/489 |
| 5,559,997 | 9/1996 | Tsuchida et al. | 395/500 |
| 5,581,475 | 12/1996 | Majors | 364/491 |

OTHER PUBLICATIONS

Wont et al.; "Test Program Development in VLSI Testing", Proceedings of the 1997 IEEE International Symposium on Circuits and Systems, vol. 4, pp. 2697–2700, Jun. 1997.

*Primary Examiner*—Kevin J. Teska
*Assistant Examiner*—Douglas W. Sergent

[57] ABSTRACT

A method of designing an integrated circuit employs hardware testing rule checking so as to ensure hardware testability and to ensure that automated test program generation will succeed when the design cycle reaches that stage. The method calls for, first, receiving a proposed logic design defined at a functional or behavioral level; second, defining a test bench for simulating operation of the logic design, the test bench including at least one input vector for stimulating the logic design for verifying the operation of the logic design; receiving a predetermined set of one or more hardware testing rules associated with a target tester; simulating operation of the logic design using the test bench; and, prior to releasing the logic design for logic synthesis, checking the simulation for compliance with the hardware testing rule set. Preliminary checking of the design and test bench prior to synthesis can avoid costly corrections later in connection with test program generation.

18 Claims, 4 Drawing Sheets

DIGITAL INTEGRATED CIRCUIT DESIGN SYSTEM AND METHODOLOGY WITH HARDWARE

FIELD OF THE INVENTION

This invention is in the field of semiconductor integrated circuit design, simulation and testing in general and, more specifically, includes improvements to reduce delays late in the design cycle and thereby reduce the overall design cycle time and cost.

BACKGROUND OF THE INVENTION

Modern integrated circuits have become very complex, frequently comprising literally millions of transistors. Microprocessors are a good example of integration of a complicated digital system, including memory, on a single chip. Moreover, the use of standard "cores"—optimized and well-defined circuit building blocks—together with application-specific logic, interface and other elements, supports rapid design of entire proprietary systems on a single ASIC (application specific integrated circuit), with marked advantages in reduced pin count, system size, power consumption, cost, etc. in various computer, communications and consumer applications.

Design and Simulation

The design of a digital IC involves many steps, some of them iterative. Generally, a designer begins defining a logic circuit at a behavioral level, for example using logical and mathematical structures like "a<b*c"—similar to statements in many programming languages. A behavioral definition can include loops, e.g.:

while a<c do
begin
d<log(sig1)
result<=d^2
end
for i=1 to max-count do
begin . . .

and so forth, where "sig1" may be a signal defined in the model. This behavioral level design is independent of any particular integrated circuit process or technology, and indeed is independent of logic gates or other real-world devices. The behavioral design is captured and described in a software model or file using a predetermined, standard format or "language". One example of a behavioral model is an RTL—register transfer level—description. In this description, we will refer to the behavioral level model as an RTL model although various other coding styles are known. Next, the RTL model is input to an RTL Simulator to simulate its operation and thereby confirm that it behaves functionally as intended. Examples of commercially available RTL simulators are those licensed by Cadence, Synopsis and Mentor Graphics.

The simulation is carried out using a "test bench". This is not a physical "bench" at all; rather, it is a software environment that includes the RTL or other behavioral level description of the circuit; a set of inputs or stimulae created by the designer for exercising the circuit; and a corresponding set of expected outputs or results. The test bench is written by the designer and is usually in the ascii format. Usually it contains only the logic levels (conditions) of the inputs. The designer will check the waveform to make sure the circuit behaves as expected. In cases where the designer knows the expected outputs, he/she can list the expected outputs in a separate file and the test bench can call for that file to conduct a simulation comparison and report the mismatches.

After simulation and test program/test pattern generation, the original test bench then becomes the test pattern containing vectors (still in ascii format) in the required format for the target tester. Only after the pattern is compiled on the tester, it is converted to to binary format. The test bench interfaces with and executes the simulator. The RTL simulator executes the circuit model in software, and in doing so outputs (1) a log file; (2) warnings; and (3) results of the simulation as compared to expected outputs. Another form of output from a simulator is data which can be viewed by a waveform viewer. The log file is a complete record of every change in every node value. It is sometimes called a vcd file—value change dump. The designer examines the simulation output, and makes adjustments to the design as required. The behavioral model is updated accordingly, and the simulation is repeated as required until the design at least meets the functional requirements. The test bench may also require modification. Once the simulation operates as expected, the functional design is approved, the system is ready for logic synthesis.

Logic Synthesis

Synthesis software receives the behavioral model, e.g. RTL code and converts it into a "gate-level" circuit design or "netlist", based on libraries of circuit descriptions in a given technology or process. Easier said than done, this step requires sophisticated software running on powerful workstations and is generally time consuming. The synthesis work is supported by software "libraries" defining individual gates, and higher level circuits or "cells". The libraries contain logical "behavioral" as well as detailed electrical specifications, sometimes called "models".

After completion of synthesis, the netlist is checked for design rule and timing compliance. The gate libraries may include timing specifications as well, or separate timing modeling software can be used for timing analysis. Next, gate level simulation is conducted, using essentially the same test bench as was written previously for testing the RTL level design.

Each semiconductor manufacturer has additional software, generally proprietary, for taking the completed netlist and generating the further detailed specifications, mask, etc. for actually fabricating the parts on silicon. Fabrication of the parts of course takes a great deal of time and specialized equipment. Any changes in the design at this late stage are very expensive and time consuming to implement. Every effort must be made to ensure working silicon the first time. In any event, after first silicon devices are made, they must be tested.

Device Testing

Testing, specifically digital integrated circuit testing, is carried out using special hardware "testers". Commercially available hardware testers include those made or licensed by Credence (e.g. "Logic 100", "STS"and "SC212"), Schlumberger and Teradyne to name a few. These logic testers are programmable and operate under control of specific test programs developed for testing the specific device at hand. Automatic test program generators are known for generating such test programs for a given target tester based on the netlist and the test bench provided as inputs. More specifically, output from the simulation (containing test bench information) is included among inputs to the test program generator.

Since the designer already created a test bench—a definition of inputs and outputs for verifying the behavioral design, the corresponding simulation can be ported to the hardware tester to test the silicon device. Thus, the test bench and the netlist are input to the automatic test program generator. However, each hardware tester imposes certain limitations and requirements on the test program. Therefore, as a practical matter, only a subset of all possible ways to stimulate a device can be ported to a tester. Those constraints include, but are not limited to the following:

One signal can only change state at one fixed time offset to the clock signal for one test block;

One signal can not change state more than twice in one clock cycle (e.g. 0-1-0 or 1-0-1);

One pin cannot be driven and it's output compared at the same time (bidirect conflict error);

There are only a limited number of timing generators available on the tester (One timing generator is occupied by a signal or a group of signals with a certain start time and waveform.); and The first pattern has to be X (unknown) for all inputs and Z (high impedance) for any bidirectional terminals (bidirects).

Test vector size is limited

Number of test vectors is limited

Maximum clock speed for testing is limited

Not all testers accept scan vectors

If the simulation violates any of these criteria, the automated test generation will fail, or if a test program is generated, it will fail to work on the logic tester. At this late date in the design cycle, the designer is forced to go backward and revise the test bench so that a hardware test program can be generated. Changes this late in the design process are costly. Problems in testing may not be discovered until expert test engineers analyse failed test results. What is needed is to anticipate and accommodate testing limitations earlier in the design cycle.

SUMMARY OF THE INVENTION

In view of the foregoing background summary, it is an object of the present invention to reduce the design cycle time for a semiconductor integrated circuit.

Another object of the invention is to incorporate logic testing rules early in the logic design cycle.

A further object of the invention is to avoid the need for modifying a test program after fabrication of a semiconductor integrated circuit device.

Another object of the invention is to anticipate and accommodate testing limitations earlier in the design cycle.

A more specific object is to determine at the simulation stage whether the simulation will later be portable to the hardware tester.

A still further object is automatically determine at the simulation stage whether the simulation will be suitable for a target hardware tester.

Accordingly, one aspect of the invention is a method of designing an integrated circuit so as to ensure hardware testability. More specifically, the invention seeks to ensure that automated test program generation will succeed when the design cycle reaches that stage. The new method calls for, first, receiving a proposed logic design defined at a functional or behavioral level; second, defining a test bench for simulating operation of the logic design, the test bench including at least one input vector for stimulating the logic design for verifying the operation of the logic design; further, receiving a predetermined set of one or more hardware testing rules associated with a target tester; simulating operation of the logic design using the test bench; and, prior to releasing the logic design for logic synthesis, checking the simulation for compliance with the hardware testing rule set. This preliminary checking of the design and test bench prior to synthesis can avoid costly corrections later in connection with test program generation.

Another aspect of the invention calls for checking the design and test bench against another rule set at the gate level simulation phase. Here, a more complete set of tester rules can be checked as the circuit is more specifically defined at the gate level.

The foregoing and other objects, features and advantages of the invention will become more readily apparent from the following detailed description of a preferred embodiment which proceeds with reference to the drawings.

DETAILED DESCRIPTION OF A PREFERRED EMBODIMENT

Figure 1:
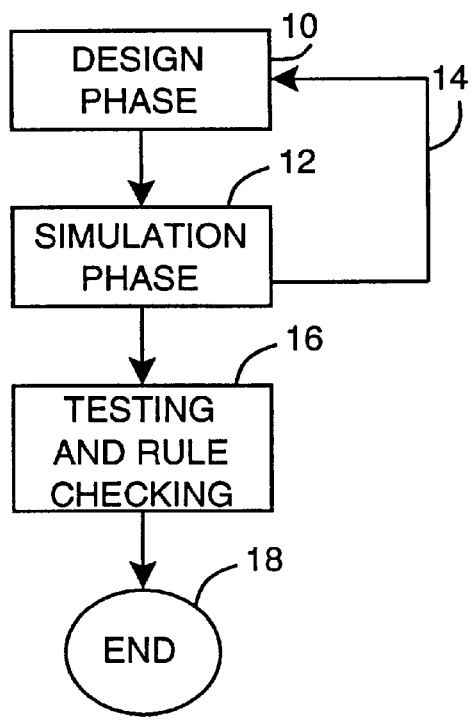
FIG. 1 is a high level block diagram of a prior art integrated circuit design cycle.

FIG. 1 is a simplified block diagram of an integrated circuit development cycle known in the prior art. In general, the development cycle begins with a design phase 10. At this phase, a designer defines a desired circuit at a behavioral level and then simulates operation of the design to verify its functionality. At this stage, the cost of design changes is de minimus, and thus the designer is free to explore various approaches. After the designer is satisfied that the proposed design at the behavioral level meets the required functionality, a gate level description of the circuit is synthesized, resulting in the creation of a netlist. The design phase also includes the development and use of a test bench, which will be described later.

Next is the simulation phase 12. In this phase, simulations are run on the circuit as described by the netlist, together with test bench information, in order to confirm that the design at this level still meets the functional criteria as reflected in the test bench. If that is not the case, the designer may have to revisit the design phase 10 as indicated by return path 14. The simulation phase 12 also includes generation of test program for testing the integrated circuit device after fabrication. The test program is subsequently executed on tester hardware as indicated in step 16. Part of this process is the automatic test program generation, which includes ensuring that the design and the test bench vectors comply with applicable tester equipment limitations, as described in the Background section above.

Figure 2:
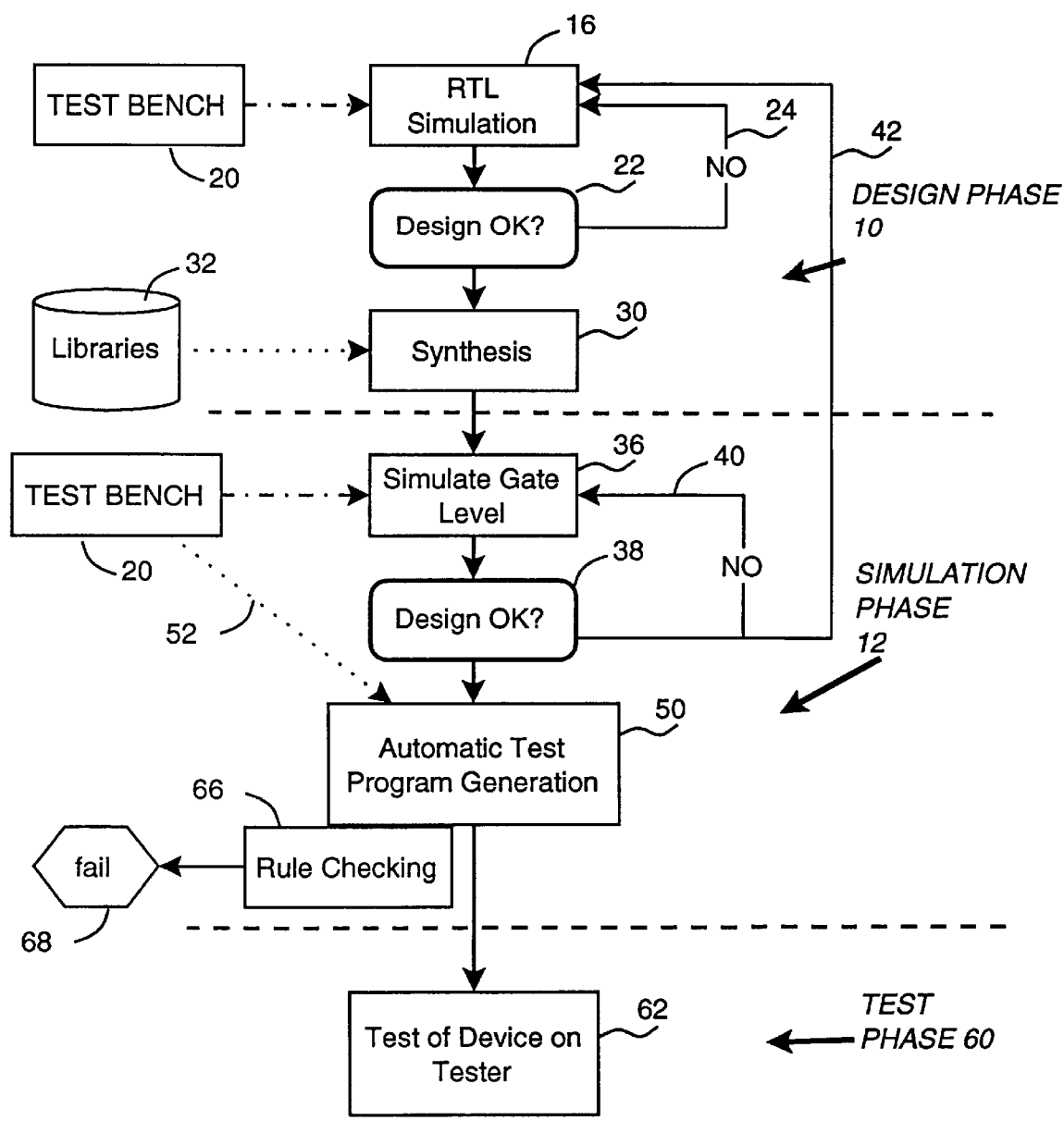
FIG. 2 is a flow chart illustrating in greater detail the prior art design cycle of FIG. 1.

FIG. 2 is a flow chart illustrating the prior art development cycle in greater detail. As before, the process begins with a design phase 10. The designer defines a circuit at a behavioral level, i.e., independent of any particular implementation or technology. The behavioral description, as mentioned earlier, generally comprises a series of statements much like a computer program expressed in a relatively high level programming language like C. The behavioral model can be expressed in RTL—Register Transfer Level—description.

Simulation software is known in the prior art for simulating operation of a design, as indicated at step 16. The simulation software works in conjunction with a test bench 20 created by the designer for this purpose. The test bench includes definitions of input conditions (logic levels) of inputs to the circuit which are used in the simulation 16 to verify its operation. The simulation program typically will provide output waveforms which the designer inspects to confirm that the circuit behaves as intended. Thus, step 22 typically includes study of these output waveforms and if the design does not function as intended, the process flows back via path 24 for the designer to reconsider the high level description and then repeat the simulation, step 16. Thus, the interactive loop formed by steps 16, 22, 24 is repeated until the design functions as required. The test bench 20 is likely to be modified during this process so that it provides appropriate stimuli to the circuit.

Once the behavioral level design is acceptable, the cycle proceeds to the synthesis step 30. In this step, synthesis software is used to convert the high level, behavioral description of the circuit into a gate level description or "netlist." The synthesis software receives as inputs various commands or scripts to guide its operation, and it has access to libraries 32 which contain technical specifications of circuit components used in forming the gate level description. Arrival at an acceptable netlist generally concludes the initial design phase 10. In the simulation phase 12, the netlist is input to simulation software, step 36, for simulating operation of the proposed design using the gate level description reflected in the netlist. Much of the same information from the test bench 20 is used in this simulation step, as the test bench again provides the inputs for exercising the circuit under development. Simulation during phase 12 is run on the gate level description of the circuit, however, rather than the more abstract behavioral or RTL description.

Next the user verifies in step 38 whether or not the circuit simulation at the netlist level complies with the defined function. It may be necessary to make adjustments in the simulation as indicated by return path 40. The simulation may also reveal errors in the RTL level description, or in the synthesis step 30, that require the designer to revisit the design phase 10 as indicated by return path 42. Once the design appears to be functioning properly, the next step in the simulation stage 12 is the generation of a test program in step 50. Automatic test program generation software, which is known in the prior art, receives as inputs test vectors from the test bench, as indicated by dashed line 52, as well as the netlist.

The automatic test program generation step 50 is to generate software for the purpose of testing an actual, physical device that, hopefully, implements the circuit design as described above. That process, the test phase 60, calls for loading the test program on suitable tester hardware and testing the device, step 62. First, however, generation of a test program includes a step 66 of checking whether the vector set (the simulation results in the vcd file) can be used to form a test program that complies with the requirements of the target tester hardware. If not, the automatic test program generation fails, 68, and the designer or test engineer, is left to attempt to analyze the cause of the failure. Specific tester "rules" are described in detail later.

Figure 3:
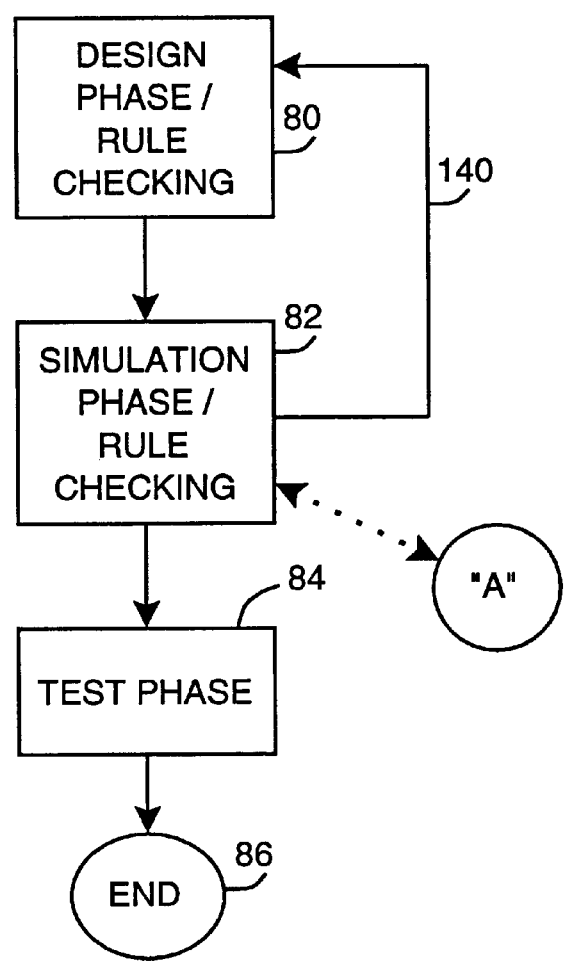
FIG. 3 is a high level block diagram of an integrated circuit design cycle according to the present invention.

FIG. 3 is a simplified high level diagram of a development cycle according to the present invention. In FIG. 3, a design phase 80 includes preliminary rule checking in order to anticipate, and avoid, potential rule violations that would prevent generation of a workable test program later in the development cycle. In the design phase 80, after the high level design meets the designer's expectations, and complies with rule checking implemented at that stage, the development proceeds to a simulation phase 82. According to the invention, the simulation phase 82 also includes provision for rule checking in order to anticipate and avoid problems in creating a test program. This rule checking operation will be described in greater detail with reference to FIGS. 4 and 5 shortly. After the simulation phase 82, including rule checking, is completed, development proceeds to the test phase 84. At this stage, actual devices are tested using the test programs and the process is complete, ending at 86.

The process described above is sometimes known as the "edit-compile-simulate" loop. These activities can be considered the design phase, in general, as distinguished from the layout of an integrated circuit device. The design part of the process involves schematic capture, compilation, and simulation as described; while the layout part involves layout floor planning, component placement, signal routing, analysis of the layout for parameters such as parasitic capacitance, and back-annotation of the original design with information derived during the layout process. After the layout, the designer will likely re-simulate for the purpose of locating any layout-induced problems. The design process may have to be repeated, this time extending the process to include layout. Layout tools are beyond the scope of the present invention, but obviously they must be used in order to complete the design and fabricate the circuit into an actual silicon part.

Figure 4:
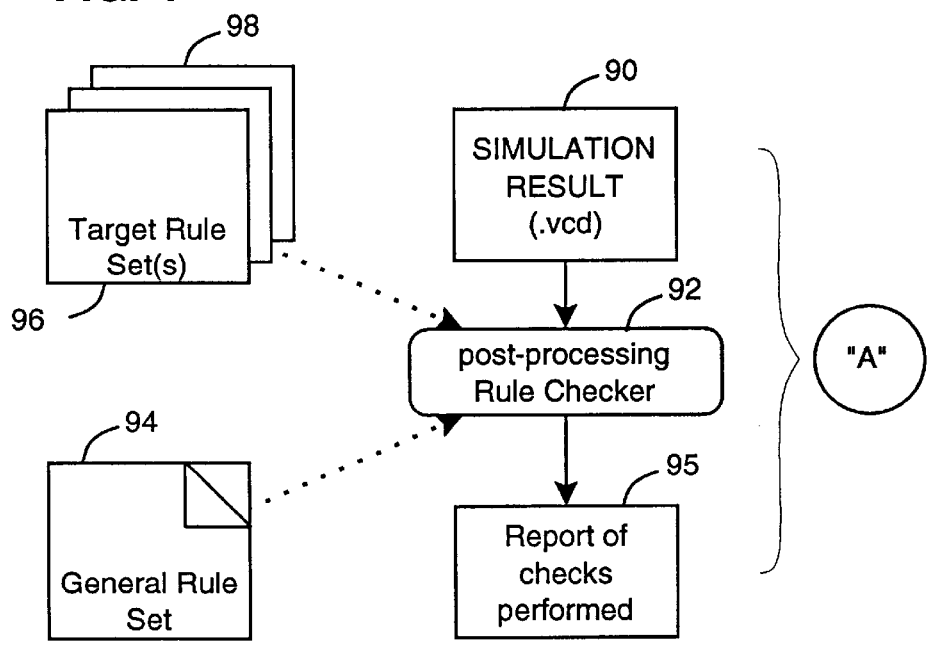
FIG. 4 is a flow chart illustrating a post-processing embodiment for tester rule checking in the simulation phase of the design cycle of FIG. 3.

As mentioned above, the simulation phase 82 in FIG. 3 includes rule checking, as indicated by the reference "A" in FIG. 3. Rule checking in connection with the simulation phase 82 can be implemented in several ways, including the following examples. Referring now to FIG. 4, one technique for implementing tester rule checking at this phase is illustrated. Here, the simulation results or .vcd file 90 is input to a post-processing rule checker in step 92. The post-processing rule checker 92 has access to a general rule set 94, i.e., a set of restrictions or criteria that are necessary to ensure successful generation of a test program in general, but are not specific to any particular tester. Additionally, the rule checker 92 has access to a target rule set 96, i.e, a set of rules or restrictions that must be met in order to form a test program for execution on a specific target tester. Alternative rule sets for other testers can be provided as well, as indicated by reference 98. The post processor examines the simulation results and checks whether the simulation complies with the applicable rule set. It provides a report 95 to the designer indicating what rules were checked and with what results. These steps help to ensure successful generation of a test program. Examples of general rules or restrictions include the following:

One signal can only change state at one fixed time offset to the clock signal for one test block;

One signal can not change state more than twice in one clock cycle (e.g. 0-1-0 or 1-0-1);

One pin cannot be driven and it's output compared at the same time (bidirect conflict error);

The first pattern has to be X (unknown) for all inputs and Z (high impedance) for any bidirectional terminals (bidirects). These general rules are applicable to most testers.

Additional rules or limitations will apply depending on the particular tester to be used, i.e. the "target tester". For each target tester:

Test vector size is limited

Number of test vectors is limited

Maximum clock speed for testing is limited

Not all testers accept scan vectors

There are only a limited number of timing generators available on the tester (One timing generator is occupied by a signal or a group of signals with a certain start time and waveform). These specific limitations, and others like them, form the target rule set.

Figure 5:
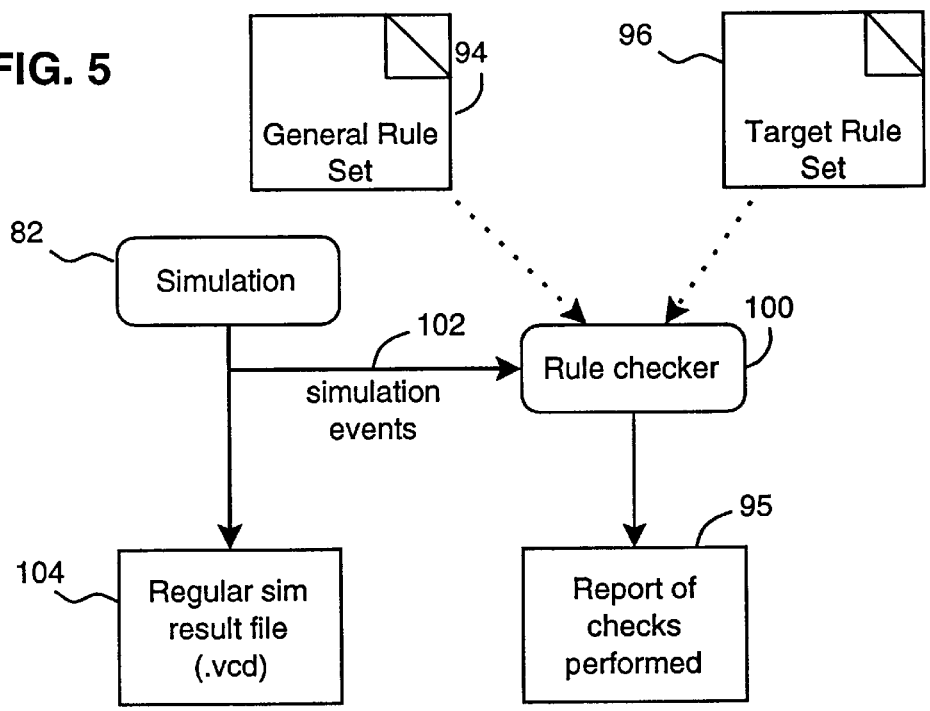
FIG. 5 is a flow chart illustrating a parallel processing embodiment for tester rule checking in the simulation phase of the design cycle of FIG. 3.

FIG. 5 illustrates an alternative methodology for checking the simulation vis-a-vis applicable rules sets in "real time" i.e., in parallel with the simulation process. In FIG. 5, rule checker software 100 receives simulation event data via path 1 while the simulation phase 82 (FIG. 3) is in progress. Rule checker 100 receives the same data as that output to the simulation result file (.vcd) 104. The rule checker 100 analyses whether the simulation events 102 comply with the applicable rules sets and provides a report similar to 95, above. This report can be used by the engineer to make modifications at the simulation phase, before attempting test program generation, in order to ensure that the test program generation will succeed.

Figure 6:
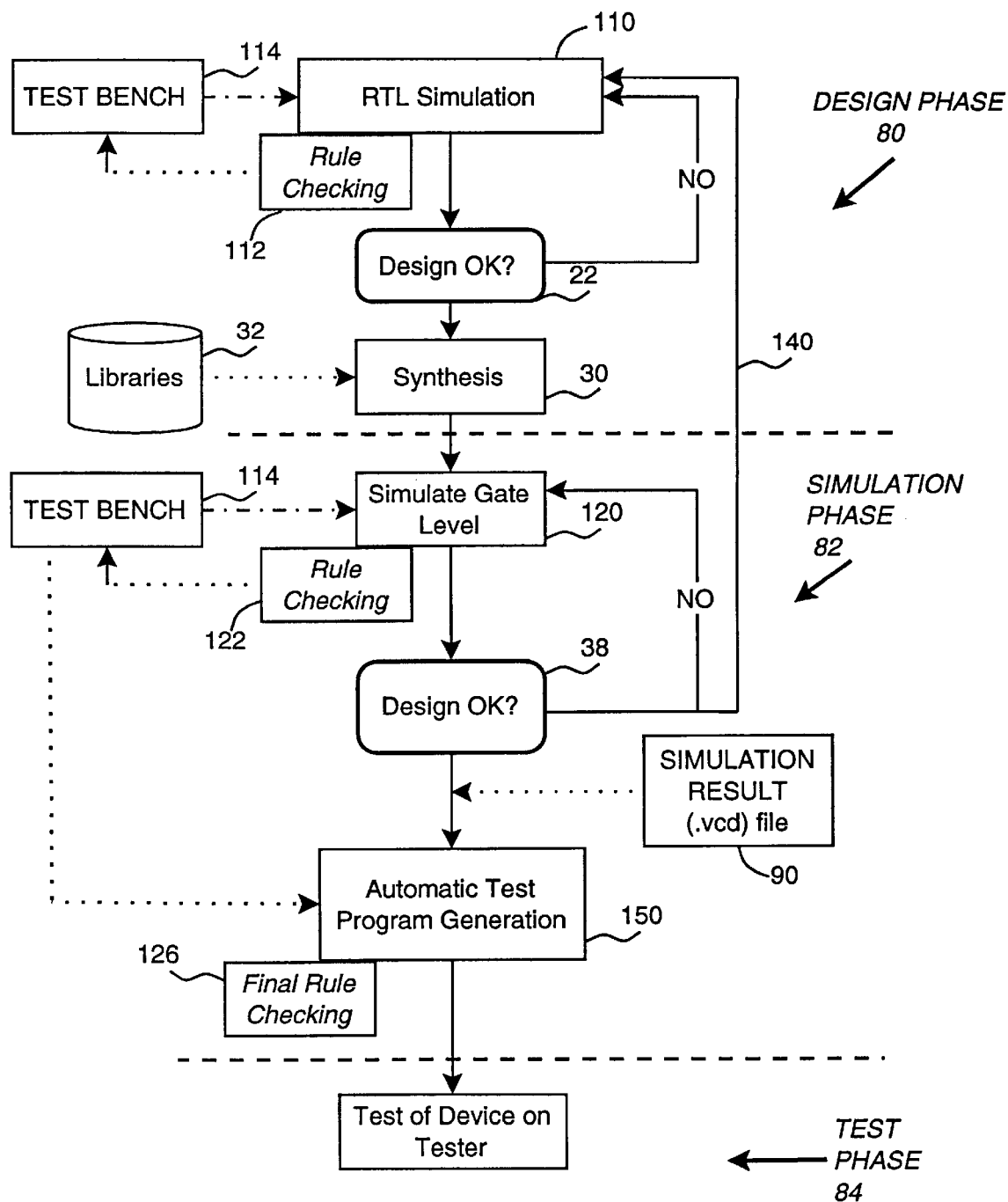
FIG. 6 is a flow chart illustrating in greater detail a design cycle according to the present invention.

FIG. 6 is a flow chart illustrating the development cycle that implements the present invention. The overall development cycle is similar in many respects to the prior art process described above with reference to FIG. 2, so only the differences are highlighted here. According to the present invention, the high level description and simulation step 110 includes a preliminary rule checking step 112 to insure that the test bench 114 and the high level design comply with applicable rules for successful test program generation. At this preliminary stage, some rules cannot yet be checked. However, certain rules that can be checked at this early stage include, for example, restrictions on the values of inputs at the first vector. This is a general requirement applicable to most testers. It requires an unknown value for all inputs at the first vector, and the value of Z (high impedance) for bidirectional. This requirement is illustrated in the following table:

| CORRECT TEST BENCH | | INCORRECT TEST BENCH | |
|---|---|---|---|
| Line # | ibii | Line # | ibii |
| 1 | xzxx | 1 | 1010 --> rule violation |
| 2 | 1001 | 2 | 1001 |
| 3 | 1110 | 3 | 1110 |
| 4 | 0111 | 4 | 0111 |

Referring again to FIG. 6, the simulation step 120 according to the invention also includes an optional rule checking step 122. This was described in some detail above with reference to FIGS. 4 and 5. At the simulation phase, more complete checking against tester rule sets can be accomplished since the design has been synthesized into a gate level description. The rule checking described above in the design phase and the simulation phase will hope to ensure successful automatic test program generation 150 and ultimately successful testing 62 of the subject device. Final rule checking 126 is still necessary prior to testing, but the likelihood of failure at this late stage is substantially reduced in view of the previous rule checking described above.

Having illustrated and described the principles of my invention in a preferred embodiment thereof, it should be readily apparent to those skilled in the art that the invention can be modified in arrangement and detail without departing from such principles. We claim all modifications coming within the spirit and scope of the accompanying claims.

We claim:

1. A method of designing an integrated circuit to ensure hardware testability comprising the steps of:

receiving a proposed logic design defined at a behavioral level;

defining a test bench for simulating operation of the logic design, the test bench including at least one input vector for stimulating the logic design and at least one corresponding output vector for verifying operation of the logic design;

receiving a predetermined set of one or more hardware testing rules associated with a target tester;

simulating operation of the logic design using the test bench; and prior to logic synthesis, checking the simulation for compliance with the hardware testing rule set.

2. A method according to claim 1 wherein the step of simulating operation of the logic design is carried out on a digital computer using a simulation program stored in a machine-readable medium coupled to the computer and the step of checking the simulation for compliance with the hardware testing rule set also is carried out on a digital computer so it is done automatically.

3. A method according to claim 2 wherein one of the hardware testing rules requires that each input signal defined by the test bench changes state only at one fixed time offset to the clock signal, and said automatically checking the simulation for compliance with the hardware testing rule set includes verifying that each input signal defined by the test bench changes state only at one fixed time offset to the clock signal.

4. A method according to claim 2 wherein one of the hardware testing rules requires that each input signal defined by the test bench changes state no more than twice in one clock cycle, and said automatically checking the simulation for compliance with the hardware testing rule set includes verifying that each input signal defined by the test bench changes state no more than twice in one clock cycle.

5. A method according to claim 2 wherein one of the hardware testing rules requires that the number of input signals does not exceed a predetermined number of timing generators available on the target tester, and said automatically checking the simulation for compliance with the hardware testing rule set includes verifying that the number of input signals does not exceed the number of timing generators available on the target tester.

6. A method according to claim 2 wherein one of the hardware testing rules requires that a first input vector provides an unknown state for all inputs and a high impedance state for all bidirectional terminals, and said automatically checking the simulation for compliance with the hardware testing rule set includes verifying that the first input vector provides an unknown state for all inputs and a high impedance state for all bidirectional terminals.

7. A method according to claim 2 wherein said automatically checking the simulation for compliance with the hardware testing rule set includes verifying that none of the test bench vectors exceeds a predetermined vector size specified in the hardware testing rule set.

8. A method according to claim 2 wherein said automatically checking the simulation for compliance with the hardware testing rule set includes verifying that the number of test vectors does not exceed a predetermined maximum number of test vectors specified in the hardware testing rule set.

9. A method according to claim 2 wherein said automatically checking the simulation for compliance with the hardware testing rule set includes verifying that a clock speed specified in the simulation does not exceed a predetermined maximum clock speed specified in the hardware testing rule set.

10. A method of designing an integrated circuit to ensure hardware testability comprising the steps of:

receiving a circuit design designed at a behavioral level;

defining a test bench for simulating operation of the circuit design, the test bench including at least one input vector for stimulating the logic design to verify operation of the circuit design;

simulating operation of the circuit using the behavioral level definition and the test bench so as to form simulation results;

receiving a predetermined set of one or more hardware testing rules associated with a target tester; and prior to attempting test program generation, checking the simulation results for compliance with the hardware testing rule set.

11. A method according to claim 10 wherein checking the simulation results for compliance with the hardware testing rule set includes;

providing a predetermined rule checking computer program stored in a machine-readable medium;

during the simulating step, executing the rule checking program;

during the simulating step, passing indicia of selected simulation events to the rule checker program; and in the rule checker program, checking the indicated simulation events for compliance with the hardware testing rule set.

12. A method according to claim 11 wherein the hardware testing rule set includes one or more general testing rules.

13. A method according to claim 10 wherein checking the simulation for compliance with the hardware testing rule set includes;

providing a predetermined rule checking computer program stored in a machine-readable medium, the rule-checking program arranged to receive as input a simulation output file;

during the simulating step, creating the simulation output file; and after completion of the simulating step, post-processing the simulation output file using the rule checking computer program.

14. A method according to claim 13 wherein the hardware testing rule set includes one or more general testing rules.

15. A method according to claim 13 wherein the hardware testing rule set includes one or more testing rules associated with a particular target tester.

16. A software system for designing an integrated circuit comprising:

a description file stored in a computer-readable medium and defining a circuit design at a behavioral level;

a test bench file stored in a computer-readable medium and including test vectors defining input logic states for use in simulating operation of the design;

a simulation computer program stored in a computer-readable medium and including means for receiving input from the description file and from the test bench file for simulating operation of the circuit responsive to the test bench file, and providing simulation results;

a predetermined set of hardware testing rules associated with a target tester for test program generation; and checking means for receiving the simulation results and checking the simulation results against the rule set to determine compliance with the rule set.

17. A software system according to claim 16 wherein the checking means includes means for post-processing the simulation results so as to check the simulation results against the rule set.

18. A system according to claim 16 wherein the set of rules includes general rules that support automated test program generation.

* * * * *